United States Patent
Koyama et al.

(10) Patent No.: US 11,505,878 B2
(45) Date of Patent: Nov. 22, 2022

(54) DIAMOND CRYSTAL SUBSTRATE, METHOD FOR PRODUCING DIAMOND CRYSTAL SUBSTRATE, AND METHOD FOR HOMO-EPITAXIALLY GROWING DIAMOND CRYSTAL

(71) Applicant: Adamant Namiki Precision Jewel Co., Ltd., Tokyo (JP)

(72) Inventors: Koji Koyama, Tokyo (JP); Seongwoo Kim, Tokyo (JP); Yuki Kawamata, Yuzawa (JP); Naoki Fujita, Yuzawa (JP)

(73) Assignee: Adamant Namiki Precision Jewel Co., Ltd., Tokyo (JP)

( * ) Notice: Subject to any disclaimer, the term of this patent is extended or adjusted under 35 U.S.C. 154(b) by 0 days.

(21) Appl. No.: 17/095,854

(22) Filed: Nov. 12, 2020

(65) Prior Publication Data

US 2021/0062362 A1 Mar. 4, 2021

Related U.S. Application Data

(63) Continuation of application No. PCT/JP2020/017910, filed on Apr. 27, 2020.

(30) Foreign Application Priority Data

May 10, 2019 (JP) .............................. JP2019-090031

(51) Int. Cl.
| | |
|---|---|
| *C30B 29/04* | (2006.01) |
| *C30B 25/18* | (2006.01) |
| *C30B 25/20* | (2006.01) |
| *C01B 32/25* | (2017.01) |

(52) U.S. Cl.
CPC .............. *C30B 29/04* (2013.01); *C01B 32/25* (2017.08); *C30B 25/186* (2013.01); *C30B 25/20* (2013.01)

(58) Field of Classification Search
None
See application file for complete search history.

(56) References Cited

U.S. PATENT DOCUMENTS

| | | | |
|---|---|---|---|
| 7,063,742 B1* | 6/2006 | Ando | ...................... C30B 29/04 117/103 |
| 2014/0124793 A1 | 5/2014 | Singh et al. | |
| 2014/0220299 A1* | 8/2014 | Yoshida | .................. C30B 29/36 428/141 |
| 2017/0009377 A1 | 1/2017 | Aida et al. | |
| 2018/0216251 A1* | 8/2018 | Aigo | ..................... C30B 23/025 |

FOREIGN PATENT DOCUMENTS

| | | |
|---|---|---|
| JP | 5454867 B2 | 3/2014 |
| JP | 2016-502757 A | 1/2016 |
| JP | 2019-006629 A | 1/2019 |
| WO | 2015/119067 A1 | 8/2015 |

OTHER PUBLICATIONS

International Search Report issued in PCT/JP2020/017910; dated Jun. 23, 2020.

* cited by examiner

*Primary Examiner* — Guinever S Gregorio
(74) *Attorney, Agent, or Firm* — Studebaker & Brackett PC

(57) ABSTRACT

A diamond crystal substrate has a substrate surface that is one crystal plane among (100), (111), and (110) and that has atomic steps and terraces structure at an off-angle of 7° or less excluding 0°.

8 Claims, 16 Drawing Sheets

DIAMOND CRYSTAL SUBSTRATE, METHOD FOR PRODUCING DIAMOND CRYSTAL SUBSTRATE, AND METHOD FOR HOMO-EPITAXIALLY GROWING DIAMOND CRYSTAL

CROSS-REFERENCE TO RELATED APPLICATIONS

The present application is a continuation application of International Application No. PCT/JP2020/17910, filed Apr. 27, 2020, which claims priority to Japanese Patent Application No. 2019-090031, filed May 10, 2019. The contents of these applications are incorporated herein by reference in their entirety.

BACKGROUND OF THE INVENTION

Field of the Invention

The present invention relates to a diamond crystal substrate, a method for producing a diamond crystal substrate, and a method for homo-epitaxially growing a diamond crystal.

Discussion of the Background

Diamond crystals are expected to be ultimate semiconductor substrates. This is because diamond crystals have numerous properties unequaled by other semiconductor materials, examples of such properties including high thermal conductivity, high electron/hole mobility, high dielectric breakdown field strength, low dielectric loss, and wide band gap. Diamond crystals have a band gap of approximately 5.5 eV, which is a significantly high value as compared with other existing semiconductor materials. Particular diamond crystals to note, among those that have been developed in recent years, include: ultraviolet emitting elements utilizing the above-described wide band gap; and field effect transistors having superior high-frequency properties.

A number of ideas of how to grow a diamond crystal have been proposed. Among these ideas, a promising production method is to grow and form a diamond crystal on a base substrate by an epitaxial growth method.

The epitaxial growth method includes a homo-epitaxial growth method and a hetero-epitaxial growth method. In the homo-epitaxial growth method, a diamond crystal substrate is used as the ground substrate. This ensures that there is no lattice mismatch between the ground substrate and the diamond crystal on which the ground substrate is formed. In the hetero-epitaxial growth method, a material other than a diamond crystal is used as the ground substrate. This causes a lattice mismatch to occur due to a lattice constant difference between the ground substrate and the diamond crystal formed. Further, as the diamond crystal grows and its thickness increases, there is a possibility of a dislocation in the diamond crystal due to a lattice constant difference. Thus, from the viewpoint of quality of the diamond crystal to be grown and formed, the homo-epitaxial growth method is preferred.

Diamond crystal substrate examples used in the homo-epitaxial growth method include a just-substrate and an off-substrate. A just-substrate is such a substrate that the surface of the diamond crystal substrate serving as the ground substrate is a just surface having an inclination of 0° relative to surfaces such as a (100) crystal plane and a (111) crystal plane. An off-substrate is such a substrate whose surface has an arbitrary inclination (off angle) relative to surfaces such as the (100) crystal plane and the (111) crystal plane (see, for example, JP 5454867B). As illustrated in FIGS. 5 and 6, by providing an off-angle of θ on the surface of a diamond crystal substrate 1, an atomic step 2 is formed on the atomic level, and terraces 3, which are connected to form atomic steps, are formed on the surface of the substrate.

If the surface of the ground substrate is made to serve as the homo-epitaxial growth surface, a diamond crystal grows and forms, taking over the crystal plane of the surface of the ground substrate. In a homo-epitaxial growth method using a just-substrate, crystallinity degrades at a fusion part between crystal islands of the diamond crystal that has been grown and formed, resulting in a crystal defect such as twin crystal. This can be explained as follows. While the growth of a diamond crystal proceeds two-dimensionally on the substrate surface, since no atomic steps exist on the just-substrate, the growth flow direction is not determined in one direction, causing a variation in the diamond crystal orientation to occur. This causes crystal surfaces of different crystal arrangements to fuse, and crystallinity degrades at the fusion part (interface) of crystal islands, resulting in a crystal defect such as twin crystal.

In contrast, in a homo-epitaxial growth method using an off-substrate, the atomic steps on the substrate surface serve as a guide for crystal lattice arrangement at the time of epitaxial growth in that the directions in which diamond crystals grow two-dimensionally agree in a plane direction of the terraces 3, as indicated by the arrows in FIG. 7. Thus, the crystal growth in which the directions of growth of diamond crystals are aligned in one direction is referred to as step flow growth. This increases the degree of diamond crystal orientation conformity and, as a result, eliminates or minimizes degradation of crystallinity at the fusion part of crystal islands of the epitaxially grown diamond crystal, reducing occurrence of a crystal defect such as twin crystal.

Example methods of processing such off-substrate include: lapping (scaife processing), which uses diamond crystal abrasive grains as abrasive agent; laser processing; and ion beam processing. In scaife processing, diamond crystal abrasive grains are used to grind the surface of the diamond crystal substrate through mechanical and thermal breakage of the abrasive grains. This has inevitably involved formation of a damaged layer that contains a crack and/or dislocation on the surface. Further, the formation of a damaged layer has made it difficult to perform highly accurate processing.

In laser processing, by locally heating the substrate by laser radiation, carbon constituting the diamond crystal is turned into carbon dioxide gas, thus being removed. Thus, since laser processing is thermal processing, laser processing is highly damaging to the substrate surface.

In ion beam processing, the substrate is irradiated with ions such as argon ions to remove carbon atoms constituting the diamond crystal. In this processing method as well, there have been roughnesses and/or damage left on the substrate surface.

Thus, even if an atomic-level flat surface is formed by these processing methods, the atomic-level flat surface is damaged. If a diamond crystal is grown on the atomic-level flat surface by epitaxial growth, the diamond crystal that is growing and forming takes over the damage of the atomic-level flat surface, resulting in a crystal defect and/or a surface roughness Ra occurring in the diamond crystal. Thus, there has been a need for an off-substrate having an atomic-level flat surface without damage.

In light of this need, there is a processing method, namely, CMP (Chemical Mechanical Polishing), that eliminates or minimizes damage and ensures a planarization. In CMP, the substrate surface is ground utilizing a chemical action (chemical action between the substrate surface and the abrasive agent), as well as a mechanical action (mechanical polishing). Thus, CMP is expected to provide a substrate surface having a high degree of planarization enough to eliminate or minimize introduction of damage to the substrate surface.

Since, however, diamond crystals are extremely hard and chemically stable, CMP processing has been regarded as being difficult to perform on diamond crystals. In light of this, the Applicant verified applicability of CMP to diamond crystal substrates, using colloidal silica as slurry. As a result, after 60 hours (3600 minutes) of CMP, there were no signs of planarization observed on the substrate surface, as illustrated in FIGS. 8 to 16. It is to be noted that FIGS. 8 to 16 are enlarged pictures of portions around two corners of a diamond crystal substrate having an octagonal outer shape.

SUMMARY OF THE INVENTION

According to one aspect of the present invention, a diamond crystal substrate has a substrate surface that is one crystal plane among (100), (111), and (110) and that has atomic steps and terraces structure at an off-angle of 7° or less excluding 0°.

According to another aspect of the present invention, a diamond crystal substrate has a substrate surface and a diamond crystal. The substrate surface is one crystal plane among (100), (111), and (110), and has atomic steps and terraces structure at an off-angle of 7° or less excluding 0°. The diamond crystal is formed on the substrate surface.

According to another aspect of the present invention, a method for producing a diamond crystal substrate includes preparing the diamond crystal substrate. Using a slurry containing at least one particle among a zinc oxide particle, a chromium oxide particle, a cerium oxide particle, a titanium oxide particle, a Iron oxide particle, a nickel particle, a cobalt particle, a vanadium particle, a copper particle, and a manganese particle, CMP is performed with respect to the diamond crystal substrate at an off-angle of 7° or less excluding 0° relative to one crystal plane among (100), (111), and (110). At a point of time when a period of time for which the CMP has been performed reaches 100 hours, that the one crystal plane among (100), (111), and (110) has atomic steps and terraces structure on an atomic level at the off-angle of 7° or less excluding 0° is checked, and that the diamond crystal substrate is formed with the crystal plane appearing on a substrate surface of the diamond crystal substrate is checked. The CMP is ended.

According to the other aspect of the present invention, a method for epitaxially growing a diamond crystal includes preparing a diamond crystal substrate. Using a slurry containing at least one particle among a zinc oxide particle, a chromium oxide particle, a cerium oxide particle, a titanium oxide particle, a Iron oxide particle, a nickel particle, a cobalt particle, a vanadium particle, a copper particle, and a manganese particle, CMP is performed with respect to the diamond crystal substrate at an off-angle of 7° or less excluding 0° relative to one crystal plane among (100), (111), and (110). At a point of time when a period of time for which the CMP has been performed reaches 100 hours, that the one crystal plane among (100), (111), and (110) has atomic steps and terraces structure on an atomic level at the off-angle of 7° or less excluding 0° is checked, and that the diamond crystal substrate is formed with the crystal plane appearing on a substrate surface of the diamond crystal substrate is checked. The CMP is ended. The diamond crystal is epitaxially formed on an atomic-level flat surface of the diamond crystal substrate by CVD under a step flow growth condition.

BRIEF DESCRIPTION OF THE DRAWINGS

A more complete appreciation of the present invention and many of the attendant advantages thereof will be readily obtained as the same becomes better understood by reference to the following detailed description when considered in connection with the accompanying drawings, wherein.

DESCRIPTION OF THE EMBODIMENTS

Figure 1:
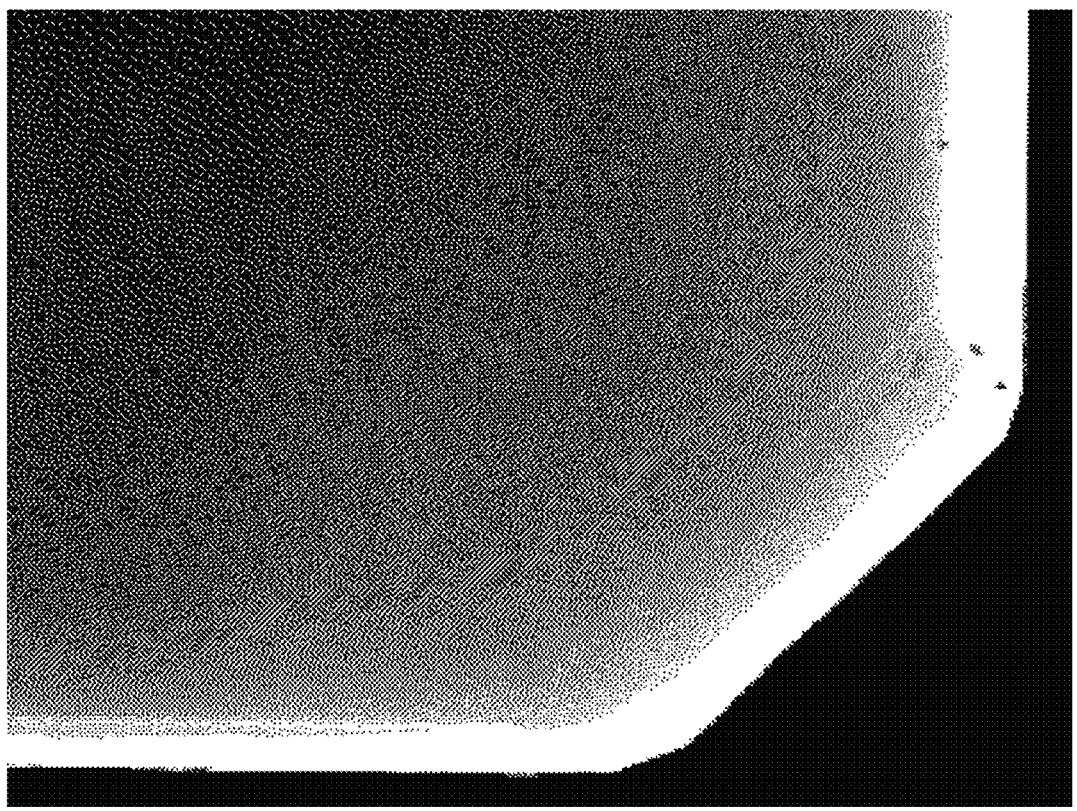
FIG. 1 is an optical microscope picture of a diamond crystal substrate surface as of the point of time when 6 hours has passed since the start of CMP.

An embodiment will now be described with reference to the accompanying drawings, wherein like reference numerals designate corresponding or identical elements throughout the various drawings.

A first feature of this embodiment is a diamond crystal substrate having a substrate surface that is one crystal plane among (100), (111), and (110) and that has atomic steps and terraces structure at an off-angle of 7° or less excluding 0°.

A second feature of this embodiment is a method for producing a diamond crystal substrate. The method includes: preparing the diamond crystal substrate; using a slurry containing at least one particle among a zinc oxide particle, a chromium oxide particle, a cerium oxide particle, a titanium oxide particle, a Iron oxide particle, a nickel particle, a cobalt particle, a vanadium particle, a copper particle, and a manganese particle, performing CMP with respect to the diamond crystal substrate at an off-angle of 7° or less excluding 0° relative to one crystal plane among (100), (111), and (110); at a point of time when a period of time for which the CMP has been performed reaches 100 hours, checking that the one crystal plane among (100), (111), and (110) has atomic steps and terraces structure on an atomic level at the off-angle of 7° or less excluding 0° and that the diamond crystal substrate is formed with the crystal plane appearing on a substrate surface of the diamond crystal substrate; and ending the CMP.

In the above-described configuration and production method, the period of time for which CMP is performed with respect to the substrate is set at 100 hours, in addition to selecting a particular slurry. This has led to the finding of CMP processing availability conditions for forming an off-substrate on diamond crystal substrates, which are extremely hard and chemically stable.

Further, by selecting a particular slurry and setting 100 hours of CMP, occurrence of pits and/or damage to the diamond crystal substrate surface is eliminated or minimized.

Further, the surface roughness Rq of the diamond crystal substrate is kept at 5 nm or less. This makes the diamond crystal substrate usable as a base crystal for epitaxial growth of a semiconductor layer.

This ensures that a desired degree of flatness (surface roughness Rq) is obtained after CMP without performing post-processing in order to obtain this degree of flatness. This shortens the production process and production time, and reduces costs involved with the diamond crystal substrate.

Also, setting the off-angle θ at 7° or less ensures that in a case where the diamond crystal substrate is used in homo-epitaxial growth, degradation of crystallinity at the fusion part (interface) of the diamond crystal that is growing and forming is eliminated or minimized. As a result, formation of a crystal defect such as twin crystal is eliminated or minimized.

A third feature of this embodiment is a diamond crystal substrate having: a substrate surface that is one crystal plane among (100), (111), and (110) and that has atomic steps and terraces structure at an off-angle of 7° or less excluding 0°; and a diamond crystal formed on the substrate surface.

A fourth feature of this embodiment is a method for homo-epitaxially growing a diamond crystal. The method includes: preparing a diamond crystal substrate; using a slurry containing at least one particle among a zinc oxide particle, a chromium oxide particle, a cerium oxide particle, a titanium oxide particle, a Iron oxide particle, a nickel particle, a cobalt particle, a vanadium particle, a copper particle, and a manganese particle, performing CMP with respect to the diamond crystal substrate at an off-angle of 7° or less excluding 0° relative to one crystal plane among (100), (111), and (110); at a point of time when a period of time for which the CMP has been performed reaches 100 hours, checking that the one crystal plane among (100), (111), and (110) has atomic steps and terraces structure on an atomic level at the off-angle of 7° or less excluding 0° and that the diamond crystal substrate is formed with the crystal plane appearing on a substrate surface of the diamond crystal substrate; ending the CMP; and epitaxially forming the diamond crystal by CVD under a step flow growth condition.

In these configurations and production method, a diamond crystal is homo-epitaxially grown on the diamond crystal substrate. This configuration eliminates or minimizes occurrence of pits and/or crystal defects in the diamond crystal. Further, the configuration ensures that the surface roughness of the diamond crystal is kept at a desired value.

Further, the configuration eliminates or minimizes degradation of crystallinity at the fusion part (interface) of the diamond crystal, eliminating or minimizing formation of a crystal defect such as twin crystal in the diamond crystal.

A fifth feature of this embodiment is that the off-angle is 5° or less or to make the off-angle 5° or less.

At this off-angle, formation of a crystal defect in the diamond crystal grown and formed on the surface of the diamond crystal substrate is eliminated or minimized more reliably. Therefore, this off-angle is more preferable.

A sixth feature of this embodiment is that the off-angle is 3° or less or to make the off-angle 3° or less.

At this off-angle, formation of a crystal defect in the diamond crystal grown and formed on the surface of the diamond crystal substrate is eliminated or minimized Therefore, this off-angle is most preferable.

Figure 5:
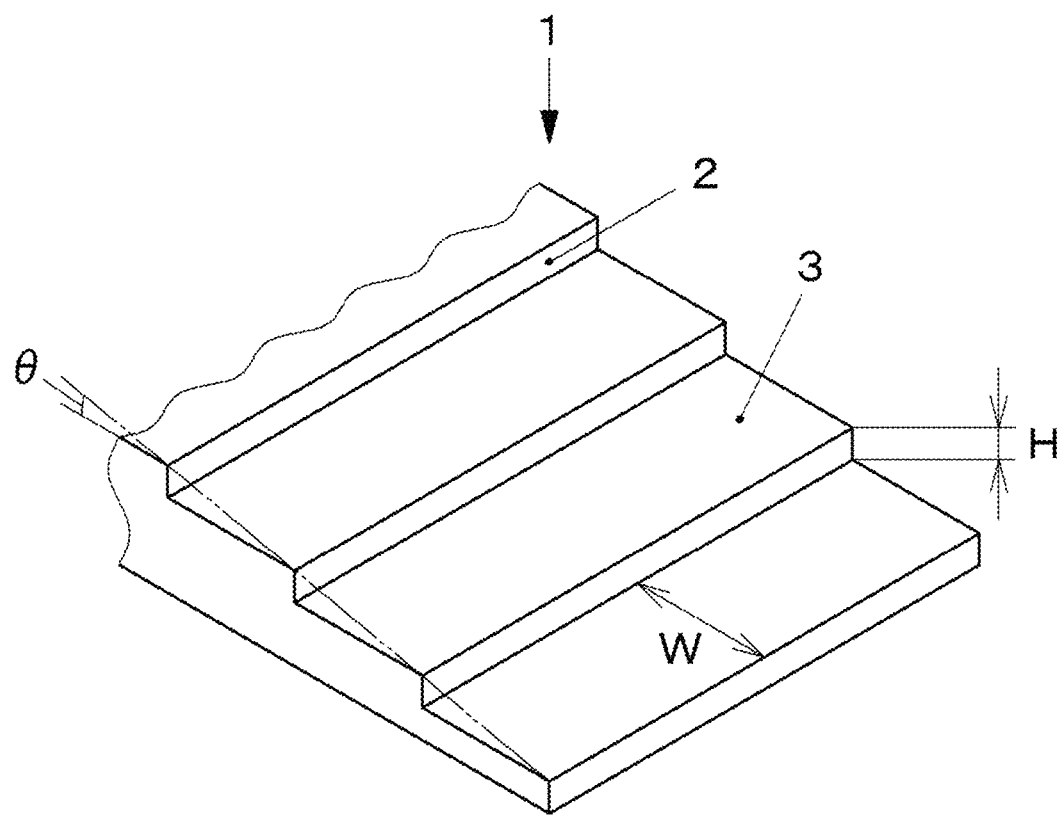
FIG. 5 is a perspective view of the diamond crystal substrate schematically illustrating atomic steps and terraces structure on the surface of the diamond crystal substrate.
Figure 6:
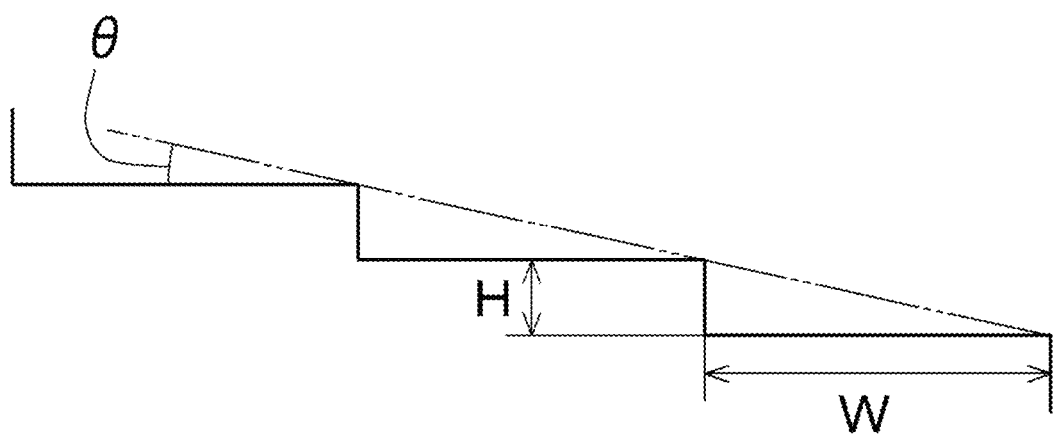
FIG. 6 is a side view of FIG. 5.
Figure 7:
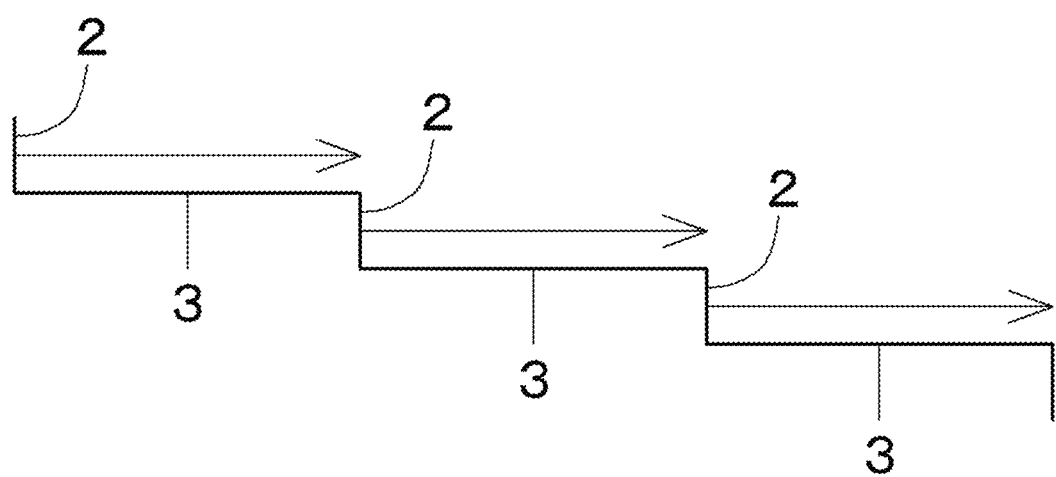
FIG. 7 is a side view of the diamond crystal substrate schematically illustrating a state in which a diamond crystal grows from the atomic steps by step flow growth.
Figure 8:
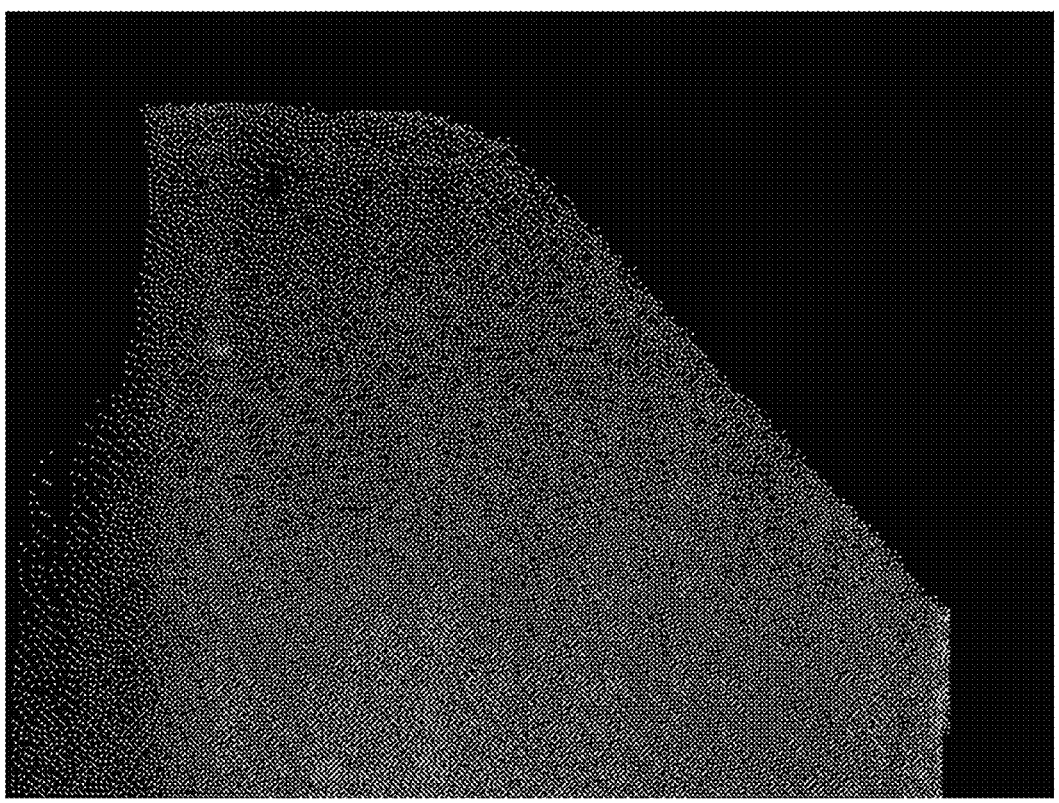
FIG. 8 is an optical microscope picture of the diamond crystal substrate surface as of the point of time when 0 minutes has passed since the start of CMP in which colloidal silica is to be used as a slurry.
Figure 9:
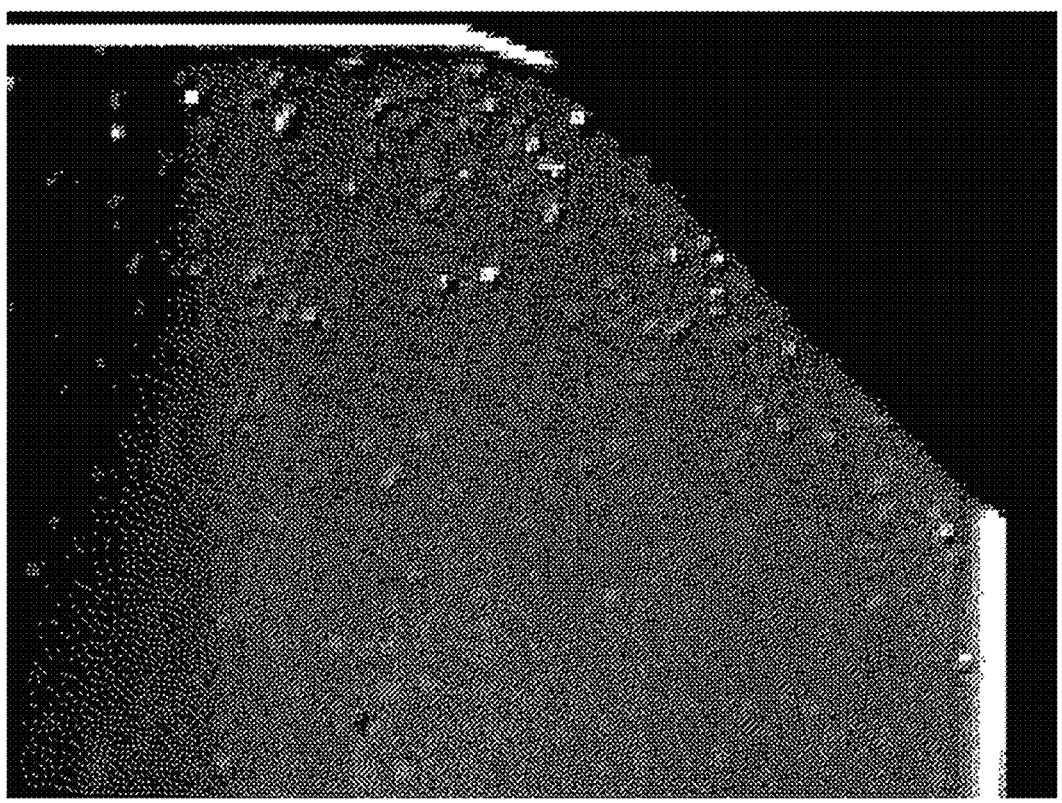
FIG. 9 is an optical microscope picture of the diamond crystal substrate surface as of the point of time when 180 minutes has passed since the start of CMP in which colloidal silica was used as a slurry.
Figure 10:
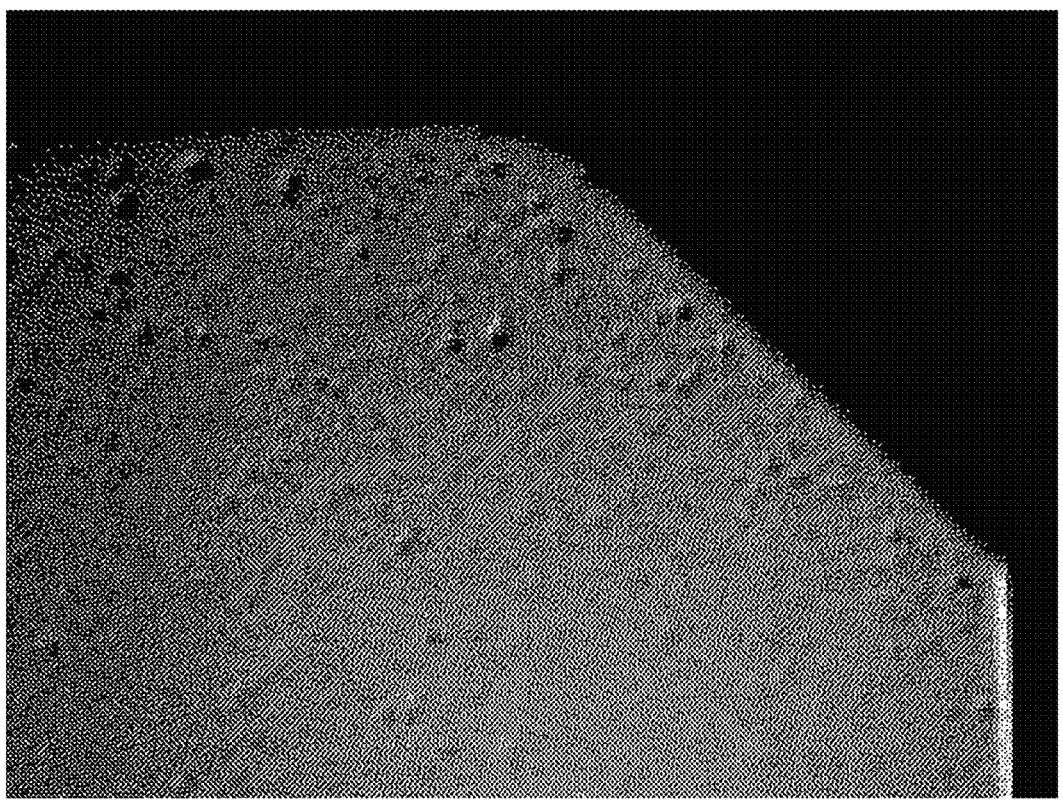
FIG. 10 is an optical microscope picture of the diamond crystal substrate surface as of the point of time when 480 minutes has passed since the start of CMP in which colloidal silica was used as a slurry.
Figure 11:
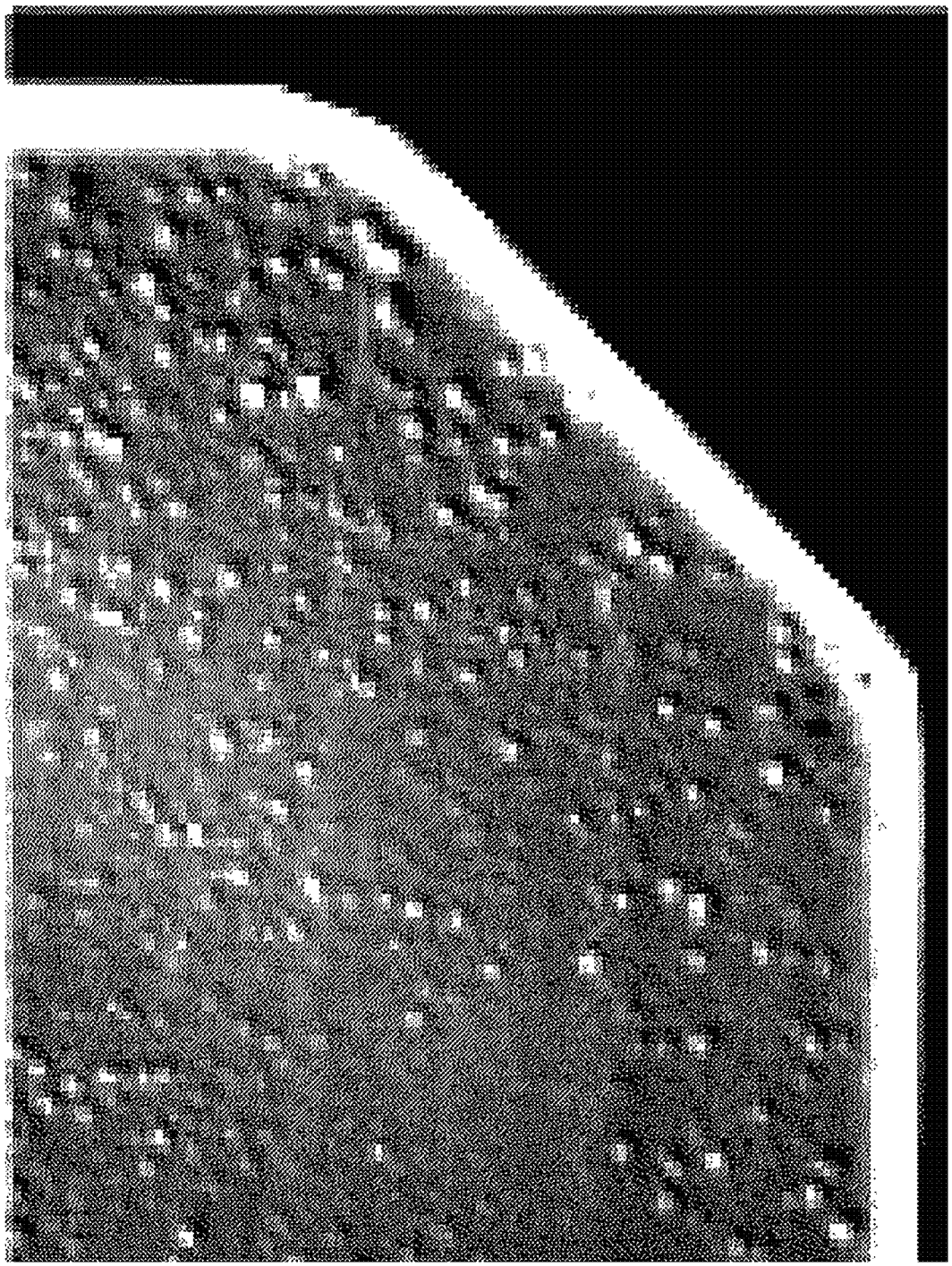
FIG. 11 is an optical microscope picture of the diamond crystal substrate surface as of the point of time when 900 minutes has passed since the start of CMP in which colloidal silica was used as a slurry.
Figure 12:
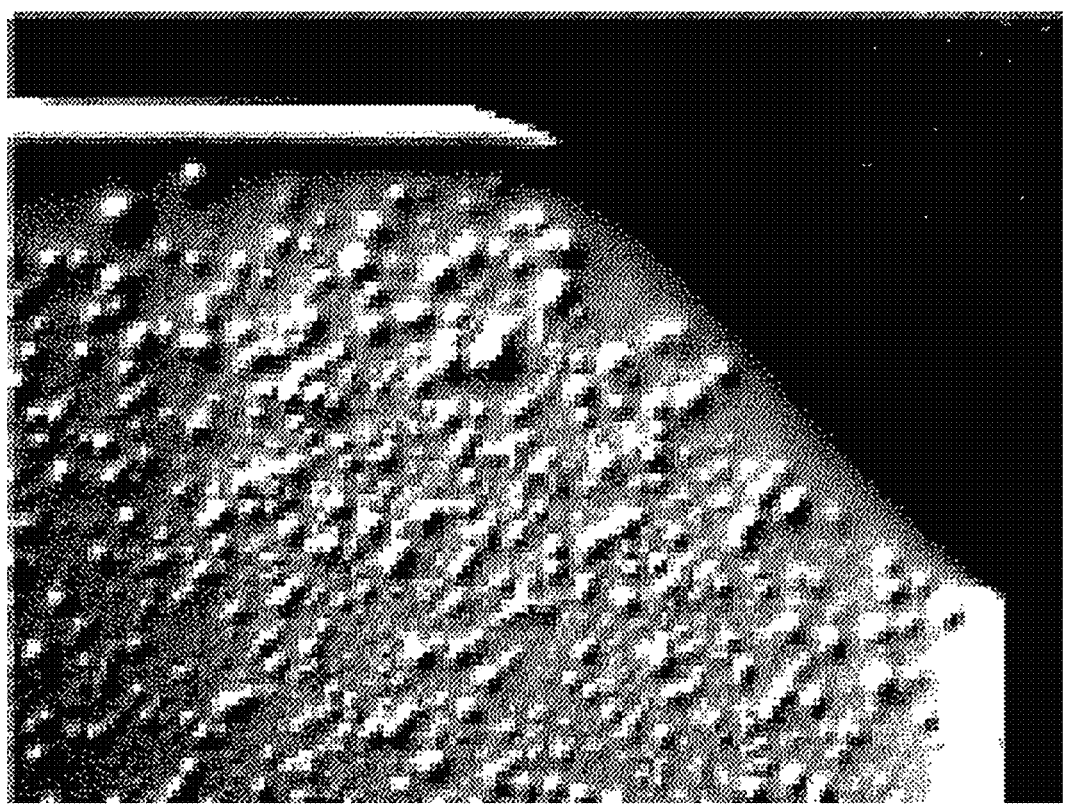
FIG. 12 is an optical microscope picture of the diamond crystal substrate surface as of the point of time when 1200 minutes has passed since the start of CMP in which colloidal silica was used as a slurry.
Figure 13:
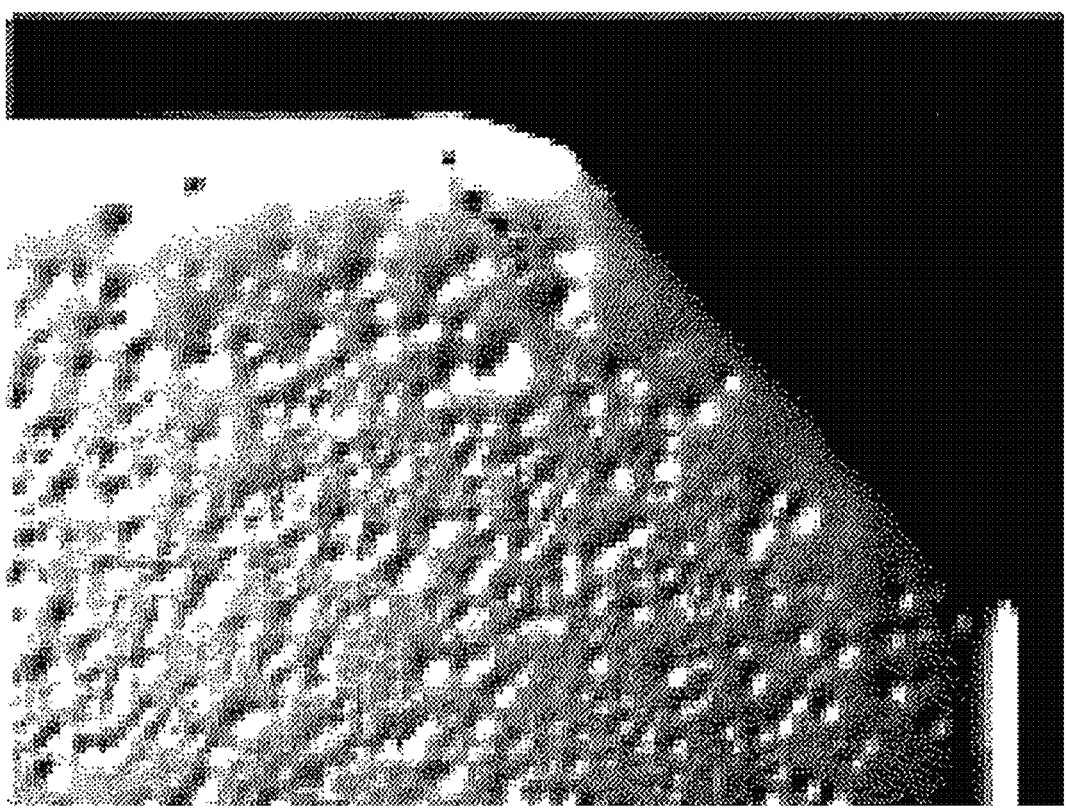
FIG. 13 is an optical microscope picture of the diamond crystal substrate surface as of the point of time when 1800 minutes has passed since the start of CMP in which colloidal silica was used as a slurry.
Figure 14:
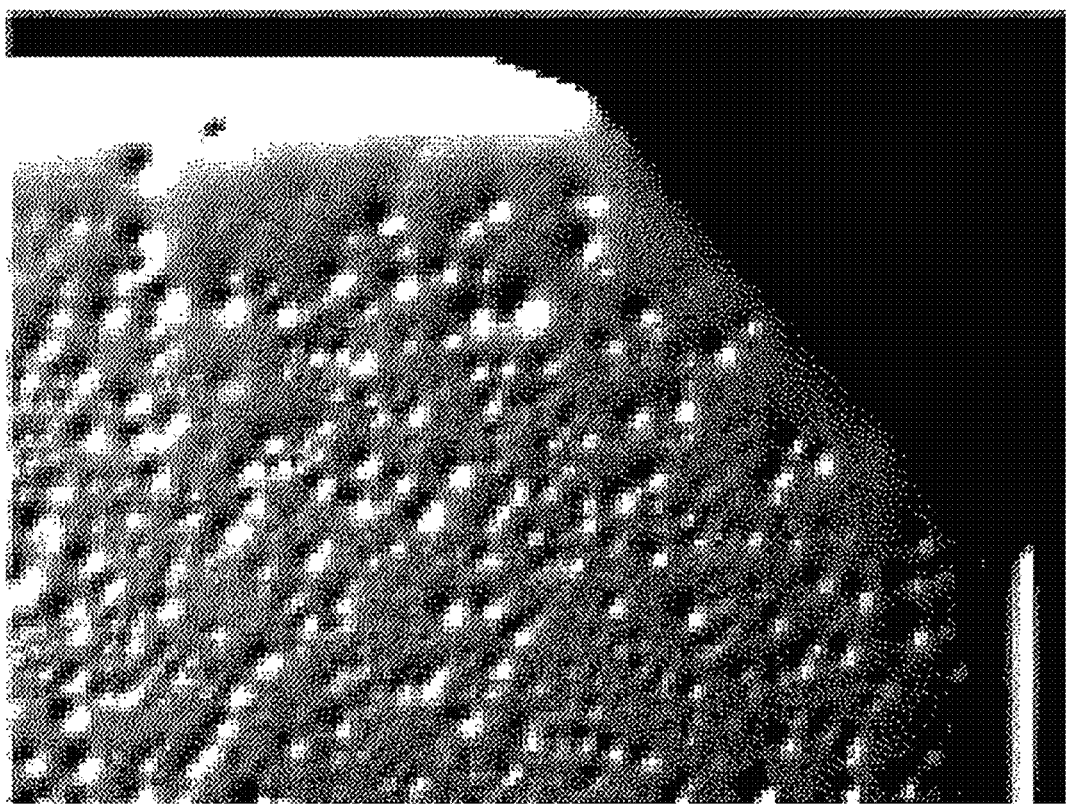
FIG. 14 is an optical microscope picture of the diamond crystal substrate surface as of the point of time when 2400 minutes has passed since the start of CMP in which colloidal silica was used as a slurry.
Figure 15:
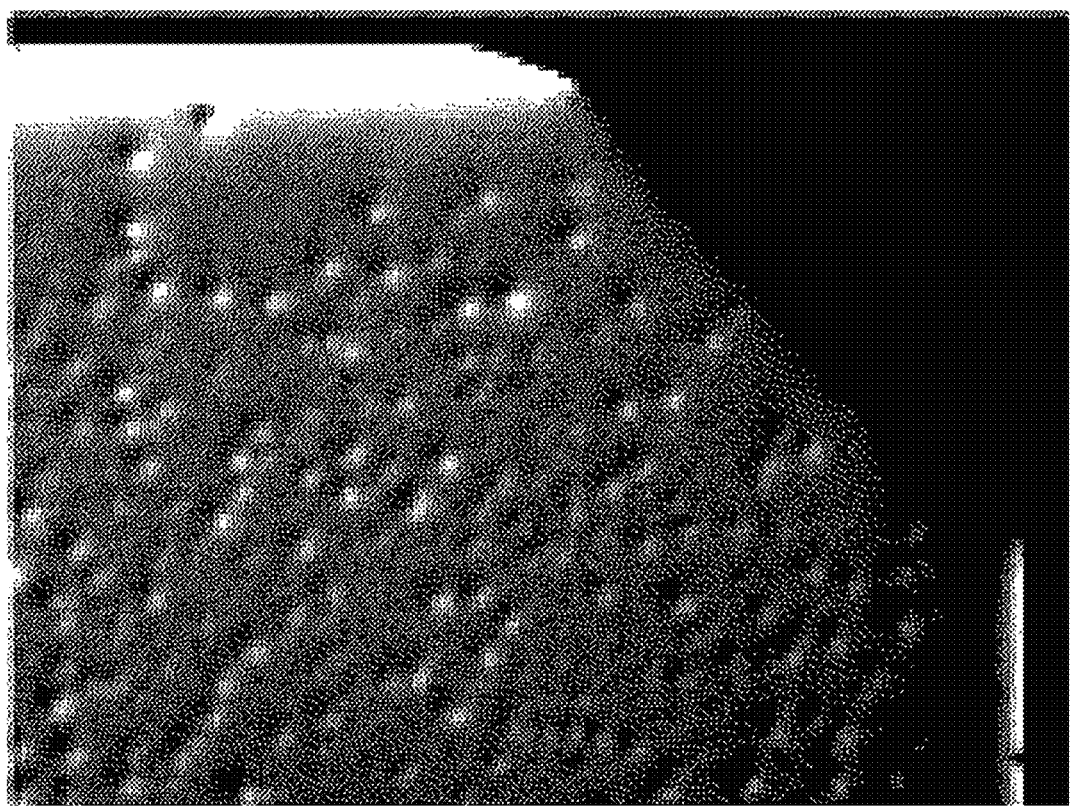
FIG. 15 is an optical microscope picture of the diamond crystal substrate surface as of the point of time when 3000 minutes has passed since the start of CMP in which colloidal silica was used as a slurry.

Embodiment 1 of the present invention will be described below by referring to FIGS. 1, 5, and 6. First, description will be made with regard to: the method according to the embodiment of the present invention for producing a diamond crystal substrate; and the diamond crystal substrate produced by the production method.

First, a diamond crystal substrate that is not subjected to CMP yet is prepared (this diamond crystal substrate will be hereinafter referred to as "substrate", as necessary). The crystal of the substrate is a monocrystal or a polycrystal, and may contain an impurity and/or a dopant.

The size, thickness, or outer shape of substrate may be set in any manner deemed necessary. It is to be noted, however, that the thickness is preferably such a thickness that ensures strength high enough to eliminate or minimize handling inconveniences; specifically, the thickness is preferably 0.3 mm or more. It is also to be noted that since diamond crystals are extremely hard material, it is necessary to take into consideration cleavability and/or other properties of an element and/or a device that is to be formed; specifically, the upper limit of the thickness is preferably 3.0 mm or less. It is also to be noted that in this embodiment, a diamond crystal substrate having an outer shape of 3 mm×3 mm is taken as one example.

The substrate surface (main surface) is one crystal plane among (100), (111), and (110), taking into consideration the versatility of the substrate surface in epitaxial growth applications. The surface (main surface) may be a surface that has been subjected to mechanical polishing and/or any other processing deemed necessary. That is, damage may be introduced to the substrate surface on the preparation stage.

Next, CMP is performed with respect to the substrate surface. A slurry is used in CMP and contains abrasive agent particles of transition metal having an oxidation state of at least 3. Specifically, the slurry used contains at least one particle among a zinc oxide particle, a chromium oxide particle, a cerium oxide particle, a titanium oxide particle, a Iron oxide particle, a nickel particle, a cobalt particle, a vanadium particle, a copper particle, and a manganese particle. It is to be noted that a polishing pad may be a commercially available product.

Using the slurry and the polishing pad described above, CMP is performed. Specifically, the angle of the polishing pad is adjusted such that the off-angle θ=7° or less relative to one crystal plane among (100), (111), and (110) (it is to be noted, however, that 0° is excluded). Then, the polishing pad is pressed against the substrate surface. When the plane orientation of the surface is (100), the inclination direction of the off-angle θ is set at a direction from (100) and <100>±7° or less, or <110>±7° or less. When the plane orientation of the surface is (111), the inclination direction of the off-angle θ is set at a direction from (111) and <−1-12>±7° or less. When the plane orientation of the surface is (110), the inclination direction of the off-angle θ is set at a direction from (110) and <110>±7° or less, <100>±7° or less, or <111>±7° or less.

Setting the off-angle θ at 7° or less ensures that in a case where the substrate is used in homo-epitaxial growth of a diamond crystal, degradation of crystallinity at the fusion part (interface) of the diamond crystal that is growing and forming is eliminated or minimized. As a result, formation of a crystal defect such as twin crystal is eliminated or minimized.

Further, by setting the off-angle θ at 5° or less, formation of a crystal defect in the diamond crystal grown and formed is eliminated or minimized more reliably. Therefore, this off-angle is more preferable.

Further, by setting the off-angle θ at 3° or less, formation of a crystal defect in the diamond crystal grown and formed is eliminated or minimized Therefore, this off-angle is most preferable.

Figure 16:
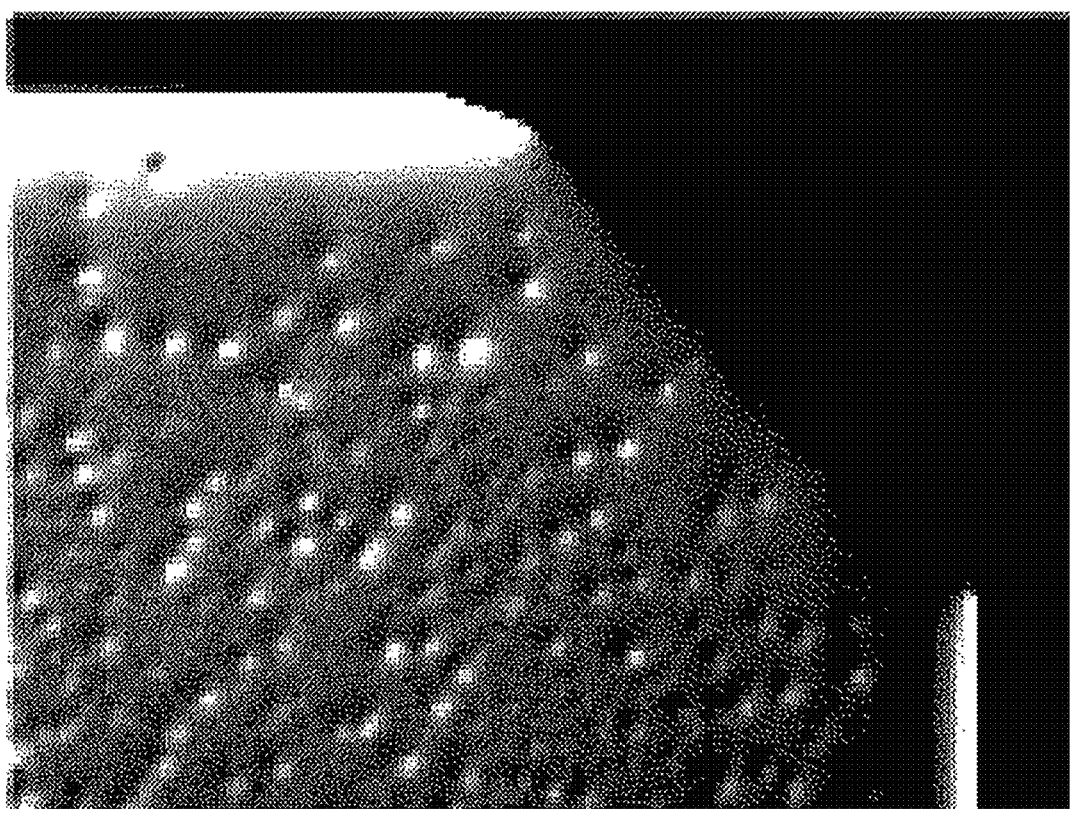
FIG. 16 is an optical microscope picture of the diamond crystal substrate surface as of the point of time when 3600 minutes has passed since the start of CMP in which colloidal silica was used as a slurry.

CMP using the slurry described above was started. At the point of time when 6 hours has passed since the start of CMP, a sign of flattening of the substrate surface was observed in a scanning electron microscope (SEM) image, as illustrated in FIG. 1. FIG. 1 is an enlarged picture of a portion around two corners of a substrate having an octagonal outer shape. A comparison between FIGS. 1 and 16 shows that there is an obvious difference in surface roughness observed in SEM images taken at the point of time when the same hours has passed since the start of CMP.

The CMP is further continued, and the CMP processing is stopped at the point of time when 100 hours has passed since the start of CMP. Then, the substrate surface is checked by SEM. By this step, that one crystal plane among (100), (111), and (110) has atomic steps and terraces structure 3 on an atomic level at an off-angle θ of 7° or less (it is to be noted, however, that 0° is excluded) as illustrated in FIGS. 5 and 6 is checked, and that a diamond crystal substrate 1 (hereinafter referred to as substrate 1) is formed with the crystal plane appearing on the substrate surface is checked. After the checking, the CMP is ended.

Stepped terraces 3 appear on the substrate 1 obtained after the CMP processing. This shows that the atoms forming the crystal are neatly arranged. The atomic level at the step height, H, is either a mono-layer step or bi-layer step height. It is to be noted that the terrace width, W, is determined based on the off-angle θ and the step height H.

Thus, the period of time for which CMP is performed with respect to the substrate is set at 100 hours, in addition to selecting a particular slurry. This has led to the finding of CMP processing availability conditions for forming an off-substrate on diamond crystal substrates, which are extremely hard and chemically stable.

Further, the surface roughness Rq of each terrace 3 of the substrate 1 is kept at 5 nm or less. Rq may be measured using a surface roughness equipment. Thus, the substrate 1 obtained is such that the surface roughness Rq of the terrace 3 is kept at 5 nm or less. This makes the substrate 1 usable as an epitaxial growth base crystal for a semiconductor layer.

Further, there are no pits and/or damage to the atomic steps 2 and terraces 3 formed by CMP processing. The principle that damage is eliminates by CMP has not been explained in detail yet. A possible explanation proposed by the applicant is that a new kind of damage attributable to CMP is quickly removed before the damage appears.

The above-described method according to the embodiment of the present invention for producing the substrate 1 ensures that a desired degree of flatness (surface roughness Rq) of each terrace 3 is obtained without performing post-processing (for example: smoothening processing of exposing the substrate 1 to hydrogen plasma; etching; and annealing) after CMP in order to obtain the desired degree of flatness of each terrace 3. This shortens the production process and production time, and reduces costs involved with the substrate 1.

A period of CMP time in excess of 100 hours is not preferable in that the machining time is unnecessarily elongated, to the detriment of large-quantity production condition optimization of the substrate 1.

In contrast, if the period of CMP time is less than 100 hours, a desired degree of flatness is not obtained in that a uniform terrace is not obtained and/or pits may occur on the terrace surface. Thus, a period of CMP time of less than 100 hours is not preferable because pits and/or a surface roughness may occur on the diamond crystal grown on the terrace.

Further, a diamond crystal is epitaxially formed by CVD (Chemical Vapor Deposition) under step flow growth conditions on the surface of the terrace 3 of the substrate 1 that has been subjected to the CMP. Thus, the diamond crystal is homo-epitaxially grown on the surface of the substrate 1. In this manner, a substrate 1 with a diamond crystal formed on the surface of the substrate 1 is obtained. To the CVD, a known CVD method is applicable, examples including microwave plasma CVD and direct plasma CVD.

The thickness of a homo-epitaxially grown diamond crystal may be set in any manner deemed necessary. For example, a diamond crystal may be grown and formed to such a degree that the atomic step 2 is filled with the diamond crystal.

By selecting the slurry and setting 100 hours of CMP, there are no pits and/or damage to atomic step 2 and/or terrace 3 on substrate 1 obtained, and a desired level of surface roughness is obtained. This configuration also eliminates or minimizes occurrence of pits and/or a crystal defect in the diamond crystal homo-epitaxially grown on the surface of the terrace 3. Further, the configuration ensures that the surface roughness of the diamond crystal is kept at a desired value.

Further, the configuration eliminates or minimizes degradation of crystallinity at the fusion part (interface) of the diamond crystal, eliminating or minimizing formation of a crystal defect such as twin crystal in the diamond crystal.

While an example according to the present invention will be described below, the present invention will not be limited to the following example.

EXAMPLE

First, a diamond monocrystal substrate having a quadrangular shape of 8 mm by 8 mm and a thickness of 0.5 mm was prepared. The crystal plane to serve as the surface (main surface) of the substrate was set at (100). Using a slurry containing titanium oxide particles, CMP was performed on the surface of the substrate in such a manner that a polishing pad was pressed against the surface in the direction of <100>+0.21° relative to (100). The period of time for which the CMP was performed was set at 100 hours. At the point of time when 100 hours passed, the CMP was ended, and the substrate surface was observed under an atomic force microscope (AFM). A result of the observation is shown in the AFM image illustrated in FIG. 2.

Figure 2:
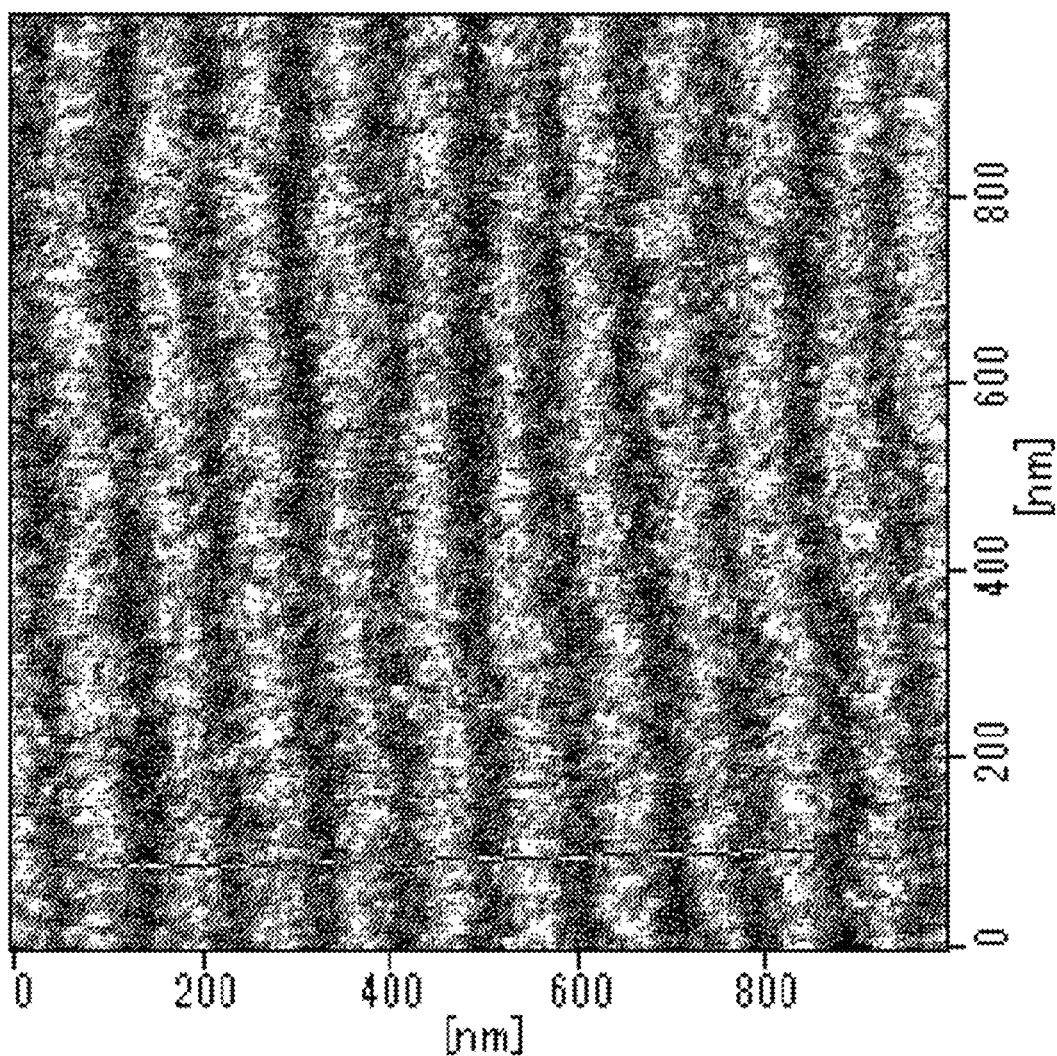
FIG. 2 is an AFM image of a diamond monocrystal substrate surface according to an embodiment of the present invention as of the point of time when 100 hours has passed since the start of CMP.

From FIG. 2, it was confirmed that stepped terraces appeared on the surface of the diamond monocrystal substrate produced under the CMP conditions of this example and that the carbon atoms forming the diamond monocrystal were neatly arranged. It was also observed that the step height was 0.36 nm and the terrace width was 100 nm on average and that no pits and/or damage were formed on the surface of each terrace. The step height H=0.36 nm was approximately equal to the lattice constant of 0.35 nm of the diamond monocrystal. Also, the surface roughness Rq of the surface of each terrace was 5 nm.

Next, under step flow growth conditions, a diamond monocrystal was homo-epitaxially grown by direct plasma CVD from each step on the substrate surface on which the terraces were formed. The thickness of the homo-epitaxially grown diamond monocrystal was set at such a degree that the atomic step was filled with the monocrystal.

The step flow growth conditions in the direct plasma CVD were: a substrate temperature of 1000° C.; a CVD furnace pressure of 100 Torr; a hydrogen gas flow rate of 475 sccm; and a methane gas flow rate of 25 sccm. It is to be noted, however, that the growth method will not be limited to direct plasma CVD; it is also possible to use microwave plasma CVD, hot filament CVD, or any other CVD method.

Figure 4:
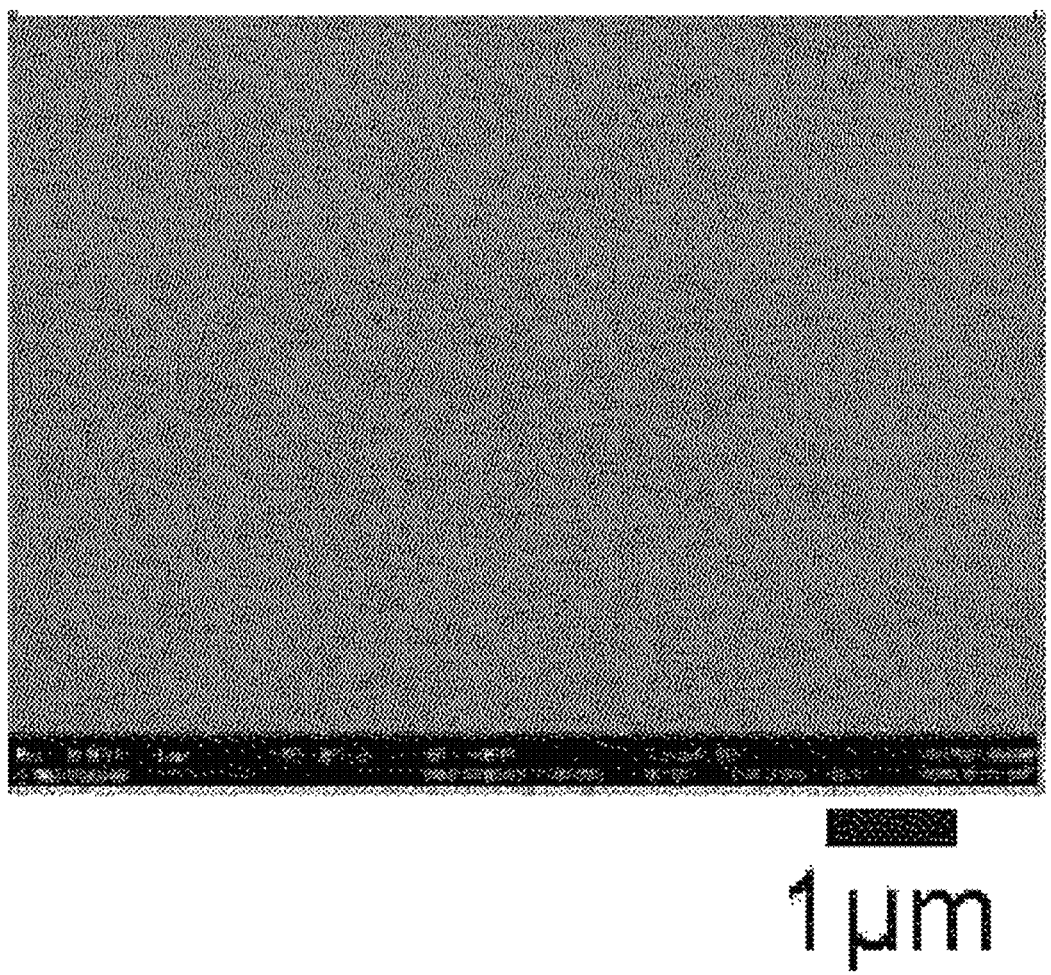
FIG. 4 is an SEM image, as of the point of time when 100 hours has passed since the start of CMP, of a surface of a diamond monocrystal epitaxially grown on the diamond monocrystal substrate according to the embodiment of the present invention.

The surface of the diamond monocrystal that was grown and formed was observed under an SEM. A result of the observation is shown in the SEM image illustrated in FIG. 4. From FIG. 4, it was confirmed that no pits and/or damage were formed in the diamond monocrystal formed by step flow growth on the surface of the diamond monocrystal substrate of this example. It was also confirmed that there was no crystal defect such as twin crystal at the fusion part between crystal planes. Also, the surface roughness Rq of the diamond monocrystal was 5 nm.

Next, as a comparative example, the period of time for which the CMP was performed on the diamond monocrystal substrate was changed to 50 hours. All other conditions were the same as in the example. Further, under the same conditions as the conditions in the example, a diamond monocrystal was homo-epitaxially grown on the substrate surface that was subjected to the CMP. Then, the surface of the diamond monocrystal that was grown and formed was observed under the SEM. A result of the observation is shown in the SEM image illustrated in FIG. 3.

Figure 3:
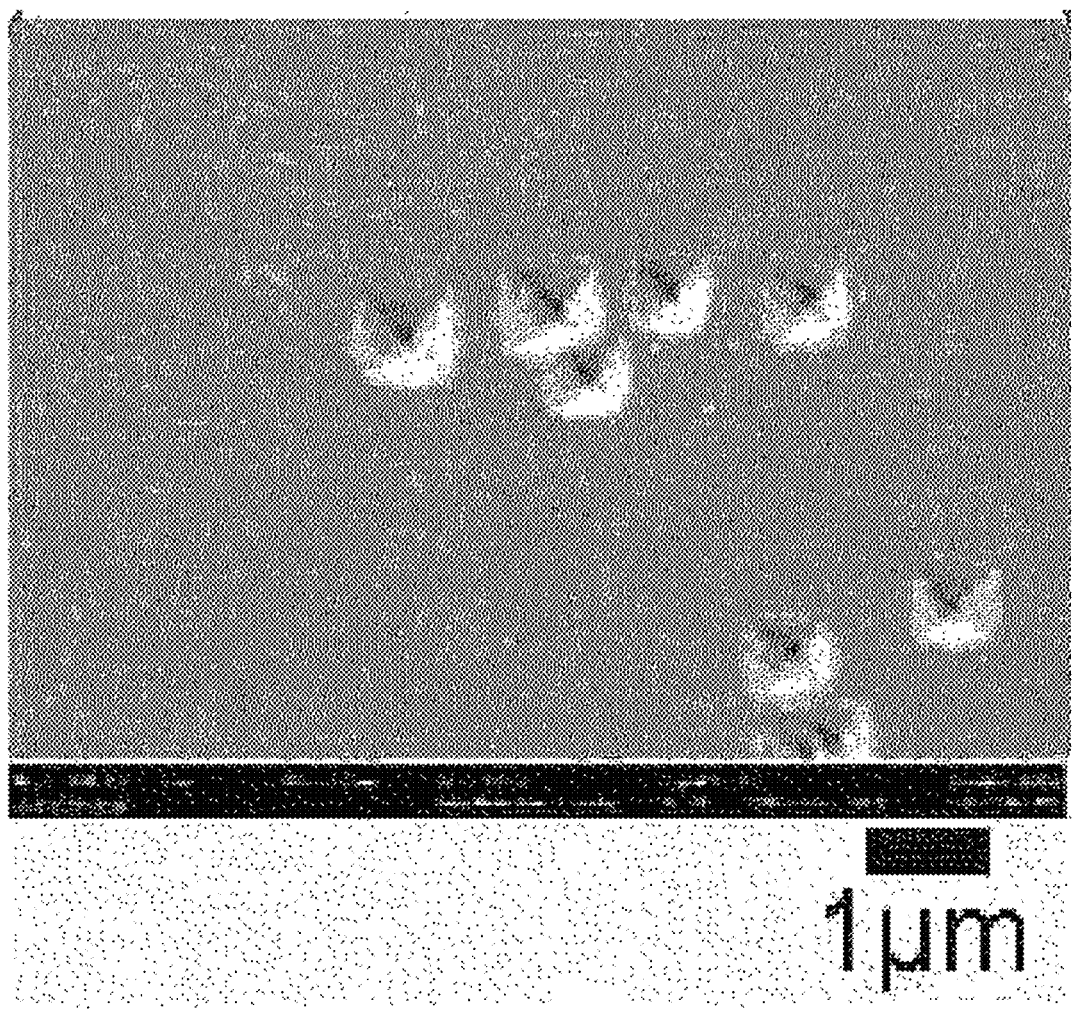
FIG. 3 is an SEM image, as of the point of time when 50 hours has passed since the start of CMP, of a surface of a diamond monocrystal epitaxially grown on a diamond monocrystal substrate according to a comparative example.

From FIG. 3, it was confirmed that pits were formed in the diamond monocrystal formed in the comparative example. Thus, it was found that pits were formed in a diamond monocrystal grown on a diamond monocrystal substrate that was processed for a period of CMP time of less than 100 hours.

In the diamond crystal substrate according to the embodiment of the present invention and the method according to the embodiment of the present invention for producing a diamond crystal substrate, the period of time for which CMP is performed with respect to the substrate is set at 100 hours, in addition to selecting a particular slurry. This has led to the finding of CMP processing availability conditions for forming an off-substrate on diamond crystal substrates, which are extremely hard and chemically stable.

Further, by selecting a particular slurry and setting 100 hours of CMP, occurrence of pits and/or damage to the steps and/or terraces on the diamond crystal substrate is eliminated or minimized.

Further, the surface roughness, Rq, of the diamond crystal substrate is kept at 5 nm or less. This makes the diamond crystal substrate usable as an epitaxial growth base crystal for a semiconductor layer.

This ensures that a desired degree of flatness (surface roughness Rq) is obtained after CMP without performing post-processing in order to obtain this degree of flatness. This shortens the production process and production time, and reduces costs involved with the diamond crystal substrate.

Also, setting the off-angle θ at 7° or less ensures that in a case where the diamond crystal substrate is used in homo-epitaxial growth, degradation of crystallinity at the fusion part (interface) of the diamond crystal that is growing and forming is eliminated or minimized. As a result, formation of a crystal defect such as twin crystal is eliminated or minimized.

Further, in the diamond crystal substrate according to the embodiment of the present invention and the method according to the embodiment of the present invention for a diamond crystal, a diamond crystal is homo-epitaxially grown on an atomic-level flat surface of the diamond crystal substrate. This configuration eliminates or minimizes occurrence of pits and/or crystal defects in the diamond crystal. Further, the configuration ensures that the surface roughness of the diamond crystal is kept at a desired value.

Further, the configuration eliminates or minimizes degradation of crystallinity at the fusion part (interface) of the diamond crystal, eliminating or minimizing formation of a crystal defect such as twin crystal in the diamond crystal.

As used herein, the term "comprise" and its variations are intended to mean open-ended terms, not excluding any other elements and/or components that are not recited herein. The same applies to the terms "include", "have", and their variations.

As used herein, a component suffixed with a term such as "member", "portion", "part", "element", "body", and "structure" is intended to mean that there is a single such component or a plurality of such components.

As used herein, ordinal terms such as "first" and "second" are merely used for distinguishing purposes and there is no other intention (such as to connote a particular order) in using ordinal terms. For example, the mere use of "first element" does not connote the existence of "second element"; otherwise, the mere use of "second element" does not connote the existence of "first element".

As used herein, approximating language such as "approximately", "about", and "substantially" may be applied to modify any quantitative representation that could permissibly vary without a significant change in the final result obtained. All of the quantitative representations recited in the present application shall be construed to be modified by approximating language such as "approximately", "about", and "substantially".

As used herein, the phrase "at least one of A and B" is intended to be interpreted as "only A", "only B", or "both A and B".

Obviously, numerous modifications and variations of the present invention are possible in light of the above teachings. It is therefore to be understood that within the scope of the appended claims, the present invention may be practiced otherwise than as specifically described herein.

What is claimed is:

1. A diamond crystal substrate having a substrate surface that is one crystal plane among (100), (111), and (110) and that has atomic steps and terraces structure at an off-angle of 7° or less excluding 0°, wherein the diamond crystal substrate has a surface roughness of 5 nm or less.

2. The diamond crystal substrate according to claim 1, wherein the off-angle is 5° or less.

3. The diamond crystal substrate according to claim 2, wherein the off-angle is 3° or less.

4. The diamond crystal substrate according to claim 1, wherein the off-angle is 3° or less.

5. A diamond crystal substrate having:
   a substrate surface that is one crystal plane among (100), (111), and (110) and that has terraces connected to form atomic steps at an off-angle of 7° or less excluding 0°; and
   a diamond crystal formed on the substrate surface,
   wherein the diamond crystal substrate has a surface roughness of 5 nm or less.

6. The diamond crystal substrate according to claim 5, wherein the off-angle is 5° or less.

7. The diamond crystal substrate according to claim 6, wherein the off-angle is 3° or less.

8. The diamond crystal substrate according to claim 5, wherein the off-angle is 3° or less.

* * * * *